United States Patent
Manepalli et al.

(10) Patent No.: US 7,224,075 B2
(45) Date of Patent: May 29, 2007

(54) METHODS AND SYSTEMS FOR ATTACHING DIE IN STACKED-DIE PACKAGES

(75) Inventors: Rahul N. Manepalli, Phoenix, AR (US); Shinobu Kourakata, Tokyo (JP); Nina Ricci P. Buenaseda, Manila (PH)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/918,585

(22) Filed: Aug. 13, 2004

(65) Prior Publication Data
US 2006/0033192 A1    Feb. 16, 2006

(51) Int. Cl.
H01L 23/48    (2006.01)
H01L 23/52    (2006.01)
H01L 29/40    (2006.01)
H01L 23/02    (2006.01)

(52) U.S. Cl. .................. 257/783; 257/686; 257/723; 257/784; 257/777; 257/E23.116

(58) Field of Classification Search ............... 257/777, 257/686, 723, 784, 783
See application file for complete search history.

(56) References Cited

U.S. PATENT DOCUMENTS

| | | | |
|---|---|---|---|
| 5,709,957 A | 1/1998 | Chiang et al. | |
| 5,963,794 A * | 10/1999 | Fogal et al. | 438/108 |
| 2002/0151103 A1 | 10/2002 | Nakamura et al. | |
| 2003/0101583 A1 | 6/2003 | Tandy | |
| 2003/0102573 A1* | 6/2003 | Tanabe et al. | 257/783 |
| 2003/0141014 A1* | 7/2003 | Satoyuki et al. | 156/326 |
| 2004/0245651 A1* | 12/2004 | Nishisako et al. | 257/777 |

OTHER PUBLICATIONS

PCT International Search Report and Written Opinion of the International Searching Authority for PCT/US2005/026940, mailed Dec. 27, 2005, 11 pages.

* cited by examiner

*Primary Examiner*—Nitin Parekh

(57) ABSTRACT

A system and a method for producing a multiple-die device by attaching a die to a substrate using a first die-attach material having a first processing temperature and attaching a subsequent die using a second die-attach material having a second processing temperature such that the process of attaching the second die does not degrade the first die-attach material. For one embodiment, multiple dies are attached using each die-attach material. For one embodiment, the first die-attach material is a thermoplastic film and the second and subsequent die-attach materials are reformulations of the thermoplastic film.

12 Claims, 3 Drawing Sheets

METHODS AND SYSTEMS FOR ATTACHING DIE IN STACKED-DIE PACKAGES

FIELD

Embodiments of the invention relate generally to the field of integrated circuit devices and more specifically to methods for stacking die to create a stacked-die device.

BACKGROUND

If chips can be packaged more densely on the surface of a circuit board, the dimensions and cost of the module can be reduced and system performance improved. One possible method of maximizing packaging densities involves placing chips atop one another to form three-dimensional stacks referred to as stacked-chip devices or stacked-die devices. Over the past several years there has been great interest in stacking chips where possible. Such chip-stacking schemes include stacking a number of decreasing sized chips in order to facilitate the wire-bonds or stacking a number of same-sized chips using spacers or employing a beveling technique. Typically the lower-most die of the stacked-die device is attached to the substrate using a die-attach material such as a paste-based adhesive. The same die-attach material is used to attach subsequent die in the stacked-die device one to another. Typically the paste-based adhesive is applied as a liquid, the die is placed on the substrate (or upon another die), and the adhesive is then cured. During curing, the adhesive is raised to a relatively high temperature. To attach a subsequent die of a stacked-die device, the process is repeated. As the trend moves toward stacking more die, from 2–4 stacked die, in typical devices today, to 6–8 stacked die in the near future, and more, problems arise with the die-attach material. Repeatedly raising the temperature to cure each subsequent adhesive layer causes degradation of the previously applied adhesive layers.

Moreover, in some situations, the use of a paste-based adhesive as a die-attach material is not optimal, and is being replaced by a film die-attach material. For example, for some applications an extremely thin die may be desired. A typical die may be 725 microns thick, but for a given application (e.g., wireless communications), a die 25 microns thick may be desired. For such thin die, the imbalance in metal density from one side of the die to the other causes the die to warp. Such warping renders the use of a paste-based adhesive as a die-attach material problematic as the warped die does not maintain contact with the paste-based adhesive throughout the curing process.

Additionally, where the die package has dimensions approximately equal to the die, using a paste-based adhesive for a die attach material may lead to bleedout of the paste, which may interfere with a subsequent wire-bonding process.

These problems are addressed through use of a lamination process using a film die-attach material such as a thermoplastic-based film, which is beginning to gain popularity as the die-attach material of choice in stacked chipscale packages. Such material have many desired characteristics including good flowability and adhesive/cohesive strength.

In a typical lamination process using a thermoplastic film for the die-attach material, the die is laminated to the substrate (or to another die) under high temperature and pressure. The film has enough adhesive strength to hold the die flat (prevent warping) during the lamination process. To attach a subsequent die in order to form a stacked-die device, the process is repeated. This means that the die-attach film of a previously attached die is subjected to the heat and pressure of repeated laminations processes.

The repeated thermal processing can cause voids and stress in the die attach film causing delamination and warping. As a result, extreme care must be taken during successive lamination processes to prevent previous die attach film layers from delaminating or experiencing excessive deformation. This limits the ability to achieve void-free bond lines across the several dies of a stacked-die device. Moreover, the voids, cracks, and other defects caused by repeated high-temperature/high-pressure processes leads to a reduction in performance reliability.

BRIEF DESCRIPTION OF THE DRAWINGS

The invention may be best understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

Figure 1:
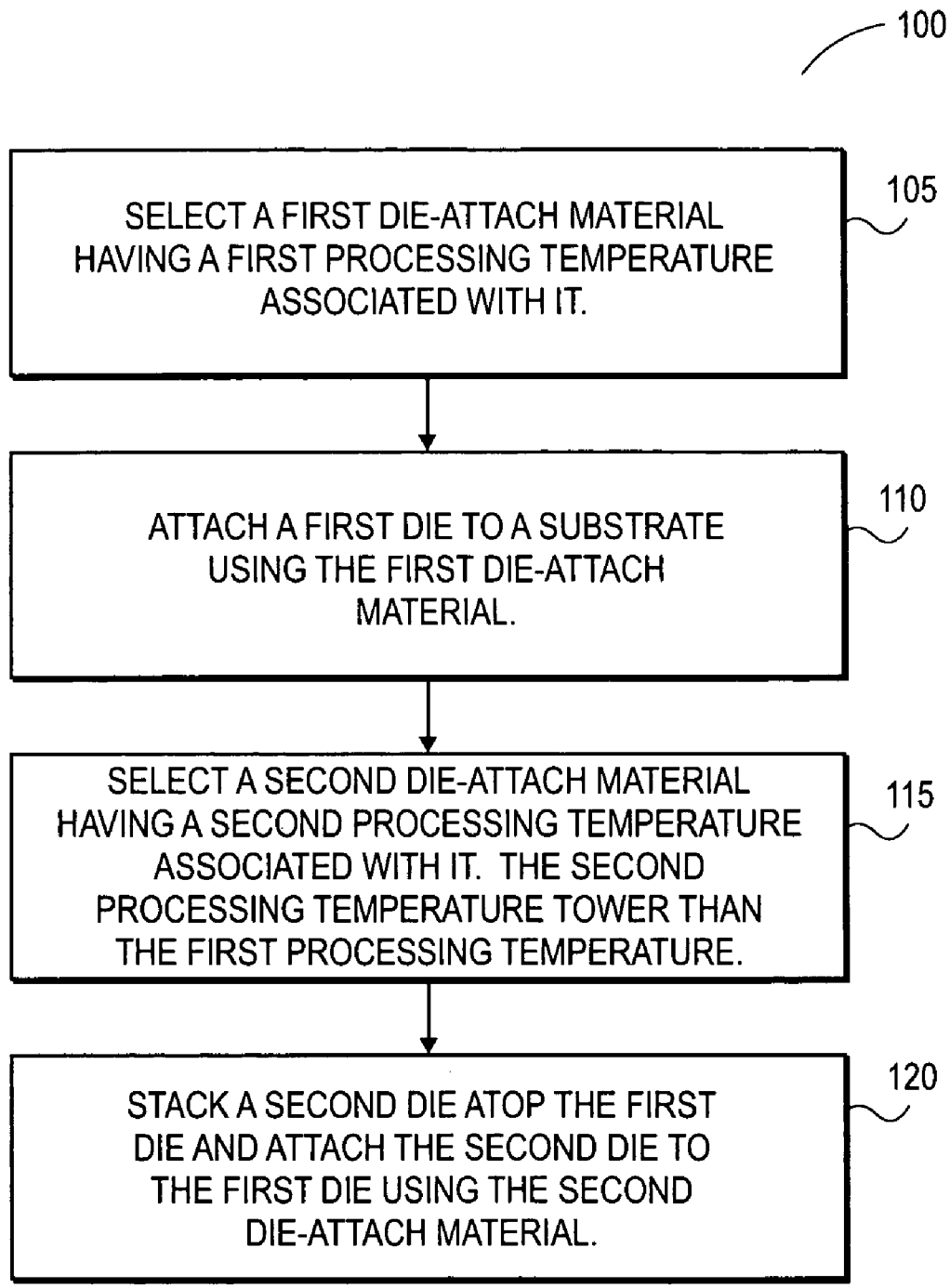
FIG. 1 illustrates a process for creating a stacked-die device in accordance with one embodiment of the invention.

FIG. 1 illustrates a process for creating a stacked-die device in accordance with one embodiment of the invention. Process 100, shown in FIG. 1, begins at operation 105 in which a first die-attach material is selected. The first die-attach material has a processing temperature associated with it. For example, if the first die-attach material is a paste-based adhesive, the processing temperature may be the curing temperature of the paste-based adhesive for one embodiment. For an alternative embodiment, if the first die-attach material is a thermoplastic film, the processing temperature is above the glass transition temperature (Tg) of the thermoplastic film.

At operation 110, a first die is attached to a substrate using the first die-attach material. The associated processing temperature of the first die-attach material is no higher than the temperature tolerance of the die and substrate.

At operation 115, a second die-attach material is selected. The second die-attach material has a processing temperature associated with it that is less than the temperature associated with the first die-attach material. A second die-attach material is selected having an associated processing temperature that is sufficiently lower than the temperature associated with the first die-attach material such that the processing (e.g., curing or laminating) of the second die-attach material will not significantly degrade the previously processed first die-attach material to within a specified degree. That is, the processing of the second die-attach material will not cause delamination, warping, or other defects to such an extent as to render the stacked-die device inoperable for its intended purpose.

At operation 120, a second die is stacked atop, and attached to, the first die using the second die-attach material.

Figure 2:
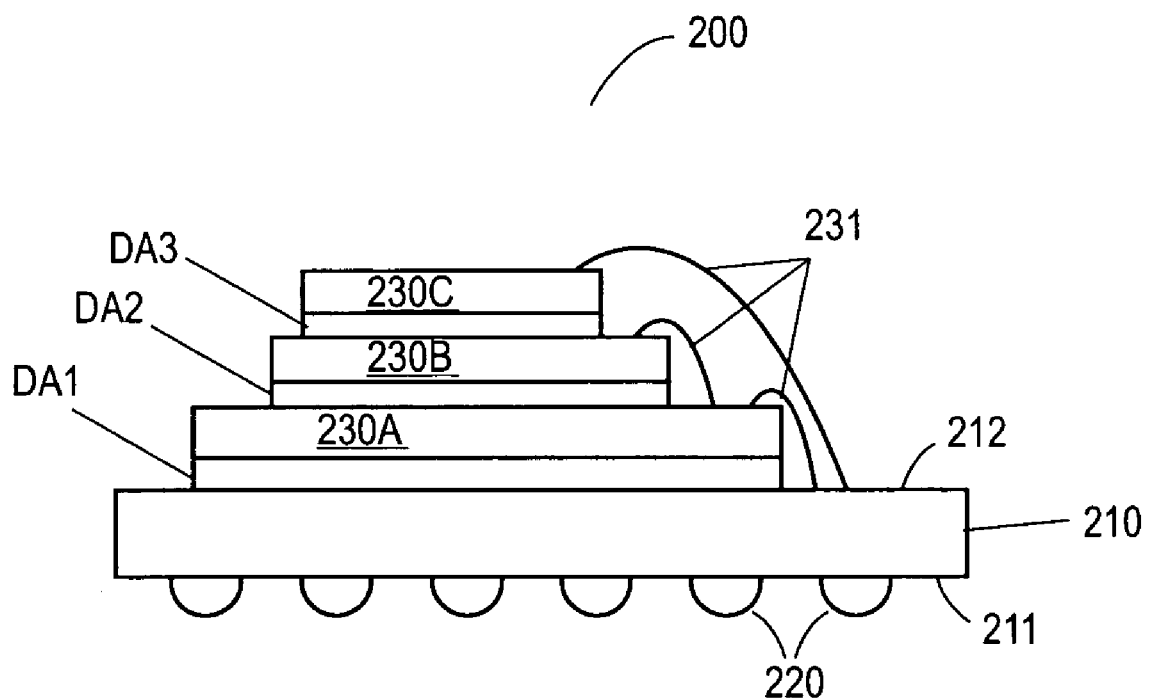
FIG. 2 illustrates a stacked-die device in accordance with one embodiment of the invention.

FIG. 2 illustrates a stacked-die device in accordance with one embodiment of the invention. Stacked-die device 200, shown in FIG. 2, includes a substrate 210 with conductive balls 220 formed on the lower surface 211 of the substrate 210. The conductive balls 220 are for electrically connecting the substrate 210 to a motherboard (not shown). A die 230a is disposed upon the upper surface 212 of the substrate 210. A die-attach material DA1 is disposed between substrate 210 and die 230a and attaches the die 230a to the substrate 210. In accordance with one embodiment of the invention, DA1 has an associated processing temperature, $T_{DA1}$.

Die 230b is stacked atop die 230a and is attached to die 230a with die-attach material DA2. In accordance with one embodiment of the invention, DA2 has an associated processing temperature, $T_{DA2}$, which is lower than $T_{DA1}$.

Die 230c is stacked atop die 230b and is attached to die 230b with die-attach material DA3. In accordance with one embodiment of the invention, DA3 has an associated processing temperature, $T_{DA3}$, which is lower than $T_{DA2}$.

As shown in FIG. 2, the stacked dies 230a–230c are wire-bonded to the substrate 210 and or one to another with wire-bonds 231. Each of the stacked dies 230a–230c may be a memory chip or a logic processor chip. For one embodiment of the invention, die 230a is a logic processor chip while dies 230b and 230c are memory chips (e.g., flash memory devices). Moreover, the number of dies forming the stacked-die device is exemplary, more or less dies may comprise the device in accordance with various alternative embodiments of the invention.

Figure 3A:
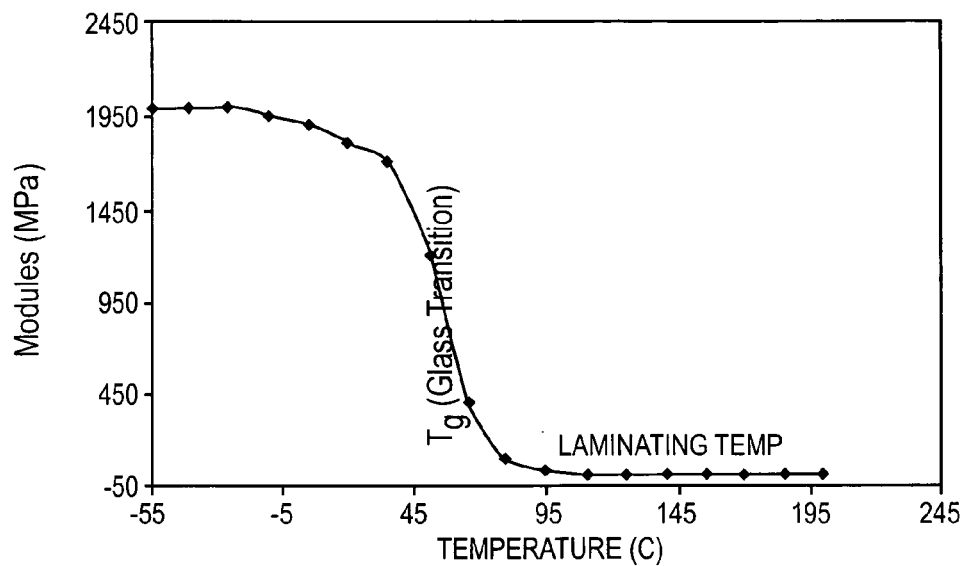
FIG. 3A illustrates a modulus/temperature graph for a typical thermoplastic film.

In accordance with one embodiment of the invention, each of multiple die attach materials may be a thermoplastic film. Conventionally, the film is applied to the substrate and heated to a specified temperature for the lamination process, which is above the Tg of the thermoplastic film. That is, in order to provide a reliable lamination, the film should be soft and flexible. The Tg is the temperature above which the thermoplastic film is soft and pliable, and below which it is hard and brittle. After raising the film above the Tg, the die is then laminated to the substrate under pressure to prevent warping. FIG. 3A illustrates a modulus/temperature graph for a typical thermoplastic film. As shown in FIG. 3A, the Tg for the film is approximately 60° C. A typical laminating process is effected with a modulus that is approximately 100 MPa and below, and ideally closer to 0 MPa. Therefore, for such a film, the laminating temperature is above the Tg and is approximately 120° C.

The problem arises when applying subsequent die to form a stacked-die device. Because the same film, having the same Tg, is used to attach a subsequent die, the previously applied film is again raised above its Tg. Repeated transitioning can degrade the film as discussed above and allow the die to warp.

In accordance with an embodiment of the invention, a thermoplastic film is used to attach a die to a substrate (e.g., DA1 of FIG. 2). The thermoplastic film may be commercially available polyamide-based materials or epoxies. A subsequent die may be attached to form a stacked-die device using a second film as described above. In accordance with one embodiment of the invention, the second film may be another commercially available die-attach material having a lower Tg. For an alternative embodiment of the invention, the second film can be a reformulation of the thermoplastic film having a lower Tg. The Tg of a polymer can be lowered by introducing a plasticizer. A plasticizer is a small molecule introduced to increase the free volume of the polymer, rendering the polymer more pliant at lower temperatures. Some typical plasticizers that may be used to lower the Tg of a thermoplastic film include low molecular weight polyimides, amine terminated rubbers and low molecular weight epoxies.

Figure 3B:
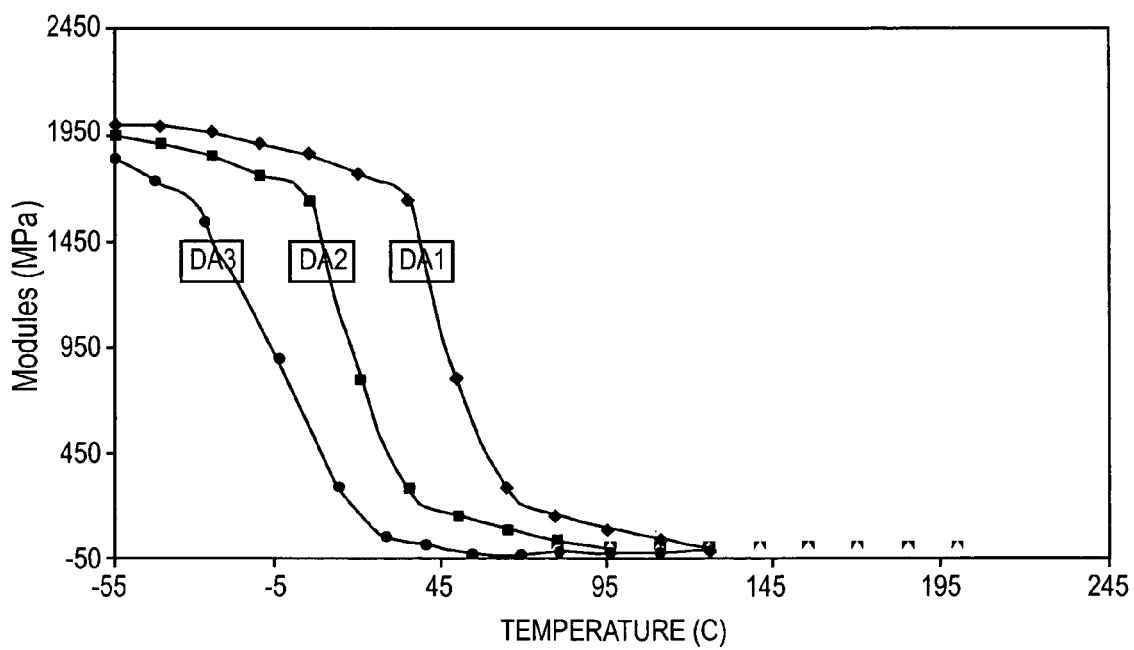
FIG. 3B illustrates a modulus/temperature graph for each of three thermoplastic films in accordance with one embodiment of the invention.

FIG. 3B illustrates a modulus/temperature graph for each of three thermoplastic films in accordance with one embodiment of the invention. As shown in FIG. 3B, the modulus/temperature graph for the first die-attach film DA1 is that illustrated in FIG. 3A and requires a processing temperature of approximately 120° C. to achieve the desired modulus below 100 MPa. DA1 has a Tg, Tg1, of approximately 60° C. The second die-attach material DA2, which may be a reformulation of DA1, has a lower Tg, Tg2, and therefore requires a processing temperature of only approximately 90° C. to achieve the desired modulus below 100 MPa. Tg2, is approximately 45° C. Therefore, during a lamination process using DA2, though DA1 will transition to some degree, it will remain rigid enough to reduce degradation and warping. The third die-attach material DA3, which may be a reformulation of DA1, has a still lower Tg, Tg3, and therefore requires a processing temperature of only approximately 90° C. to achieve the desired modulus below 100 MPa. Tg3, is approximately 30° C. Therefore, during a lamination process using DA3, DA2 will transition to some degree, and DA1 will transition even less, both will remain rigid enough to reduce degradation and warping.

General Matters

Embodiments of the invention describe using a first die-attach material to attach a die to a substrate and using different die-attach materials (having successively lower processing temperatures) to iteratively attach one or more additional die to the first die to form a stacked-die device. For an alternative embodiment, each of the die-attach materials employed may be used to successively attach multiple dies. The number of dies that may be successively attached with each die-attach material varies, and will depend upon the die-attach material and its associated processing temperature. For example, a die-attach film having a relatively high Tg, may exhibit significant degradation after more than one transition and it may therefore be desirable to attach only one die using that particular film. Subsequently, in the process of creating a stacked-die device, another die-attach film may be used having a relatively low Tg. It may be possible to attach 2 or more dies using this film, as repeated transitioning at the lower temperature is not as detrimental to the film.

An embodiment of the invention has been described as a process having various operations. Such operations are exemplary and may be described in their most basic form, but operations can be added to or deleted from the process without departing from the basic scope of the invention in accordance with various embodiments. For example, process 100, described above in reference to FIG. 1, may include additional operations in which successive die-attach materials are determined and used to attach successive dies to form a stacked-die device.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
   a substrate;
   a first die-attach material attaching a first die to the substrate, the first die-attach material having a first associated processing temperature;
   a second die-attach material attaching a second die to the first die, the second die-attach material having a second associated die-attach material processing; and
   a third die-attach material attaching a third die to the second die, the third die-attach material having a third associated die-attach material processing temperature,
   wherein the first associated die-attach material processing temperature is a first laminating temperatures, the second associated die-attach material processing temperature is a second laminating temperature, and the third associated die-attach material processing temperature is a third laminating temperature,
   wherein the first die-attach material, attaching the first die to the substrate, comprises a first thermoplastic film having a first glass transition temperature, the second die-attach material, attaching the second die to the first die, comprises a second thermoplastic film having a second glass transition temperature that is lower than the first glass transition temperature, and the third die-attach material, attaching the third die to the second die, comprises a third thermoplastic film having a third glass transition temperature that is lower than the second glass transition temperature, and
   wherein the first die-attach material achieves a different modulus at a different die-attach material processing temperature than that at the second die attach material processing temperature and does not significantly degrade at the second laminating temperature.

2. The apparatus of claim 1 wherein the second associated processing temperature is lower than the first associated processing temperature such that subjecting the first die-attach material to the second associated processing temperature does not cause voids or stress in the first die-attach material.

3. The apparatus of claim 1 further comprising:
   one or more additional dies stacked successively upon the third die, each of the one or more additional dies attached to a previous die using a successive die-attach material.

4. The apparatus of claim 1 wherein the second die-attach material comprises a reformulation of the first thermoplastic film.

5. The apparatus of claim 4 wherein the second die-attach material includes a plasticizer added to the first thermoplastic film to effect a reformulation of the first thermoplastic film.

6. The apparatus of claim 5 wherein the plasticizer is selected from the group consisting of low molecular weight polyimides, amine terminated rubbers and low molecular weight epoxies.

7. The apparatus of claim 1 wherein the first die-attach material comprises a first epoxy and the second die-attach material comprises a second epoxy.

8. The apparatus of claim 1 wherein a logic processor device is implemented on the first die and a memory device is implemented on the second die, the memory device coupled to the logic processor device.

9. The apparatus of claim 1 further comprising a plurality of first dies, a plurality of second dies, and a plurality of third dies, wherein the plurality of first dies attaches to the substrate by the first die-attach material, the plurality of second dies attaches to the plurality of first dies by the second die-attach material, and the plurality of third dies attaches to the plurality of second dies by the third die-attach material.

10. A system comprising:
    a first die;
    a logic processor device implemented on the first die;
    at least two additional dies;
    at least two memory devices implemented on each of the at least two additional dies;
    a first die-attach material attaching the first die to a substrate, the first die-attach material having a first associated die-attach material processing temperature; and
    at least two different subsequent die-attach materials attaching a corresponding set of the at least two additional dies to a previous die and to one another, each subsequent die-attach material having a respective associated die-attach material processing temperature such that each respective associated processing temperature is lower than the first associated processing temperature and each previous respective associated processing temperature,
    wherein the first associated die-attach material processing temperature is a first laminating temperature and each respective associated die-attach material processing temperature is a respective laminating temperature, and
    wherein the first die-attach material comprises a first thermoplastic film having a first glass transition temperature, and each of the at least two subsequent die-attach materials comprises a different thermoplastic film having a different glass transition temperature that is lower than the first glass transition temperature and is different from each previous respective associated processing temperature, such that the first die-attach material achieves a different modulus at a higher die-attach material processing temperature than each of the at least two subsequent die-attach materials and does not significantly degrade at of the respective laminating temperatures.

11. The system of claim 10 wherein each of the subsequent die-attach materials comprises a reformulation of the thermoplastic film effected by adding a plasticizer to the thermoplastic film.

12. The system of claim 11 wherein the plasticizer is selected from the group consisting of low molecular weight polyimides, amine terminated rubbers and low molecular weight epoxies.

* * * * *